United States Patent
Osaka et al.

(10) Patent No.: US 11,255,514 B2
(45) Date of Patent: Feb. 22, 2022

(54) ILLUMINATION APPARATUS HAVING PLANAR ARRAY OF LEDS AND MOVABLE PAIR OF LENS ARRAYS FOR MODIFYING LIGHT OUTPUT

(71) Applicant: CANON KABUSHIKI KAISHA, Tokyo (JP)

(72) Inventors: Noboru Osaka, Habikino (JP); Yoichi Oeda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/741,418

(22) Filed: Jan. 13, 2020

(65) Prior Publication Data
US 2020/0248890 A1    Aug. 6, 2020

(30) Foreign Application Priority Data

Jan. 31, 2019    (JP) .............................. JP2019-015844

(51) Int. Cl.
| | |
|---|---|
| *F21V 14/06* | (2006.01) |
| *F21V 9/40* | (2018.01) |
| *G02B 19/00* | (2006.01) |
| *F21V 5/04* | (2006.01) |
| *F21Y 115/10* | (2016.01) |

(52) U.S. Cl.
CPC ................ *F21V 9/40* (2018.02); *F21V 5/04* (2013.01); *G02B 19/0066* (2013.01); *F21Y 2115/10* (2016.08)

(58) Field of Classification Search
CPC .......... F21V 5/007; F21V 5/008; F21V 14/06; F21L 15/08
See application file for complete search history.

(56) References Cited

U.S. PATENT DOCUMENTS

| | | | | |
|---|---|---|---|---|
| 3,020,396 A | * | 2/1962 | Worboys ................. | F21L 15/02 362/331 |
| 6,290,368 B1 | * | 9/2001 | Lehrer ................. | F21V 21/0885 362/187 |
| 7,152,996 B2 | * | 12/2006 | Luk ........................ | H01R 33/09 362/240 |
| 7,717,570 B2 | * | 5/2010 | Black, Jr. ............. | G03B 21/147 353/70 |
| 7,896,524 B2 | * | 3/2011 | Yoneda ................. | F21V 7/0091 362/282 |

(Continued)

FOREIGN PATENT DOCUMENTS

| | | |
|---|---|---|
| JP | 2001-350426 A | 12/2001 |
| JP | 2018-22884 A | 2/2018 |

*Primary Examiner* — Ismael Negron
(74) *Attorney, Agent, or Firm* — Canon U.S.A., Inc., IP Division

(57) ABSTRACT

An illumination apparatus includes a plurality of LED chips arranged to form an LED array, light from the plurality of LED chips superimpose to project a light intensity distribution projected on the predetermined plane; a pair of lens arrays each including a plurality of lenses and configured to collect light from the LED arrays; a driving unit configured to adjust a distance between the pair of lens arrays and change the light intensity distribution projected on the predetermined plane; and a control unit for individually controlling the output of the first and second LED arrays.

19 Claims, 14 Drawing Sheets

(56) References Cited

U.S. PATENT DOCUMENTS

| | | | |
|---|---|---|---|
| 8,496,354 B2* | 7/2013 | Jurik | F21V 14/08 |
| | | | 362/279 |
| 9,851,074 B2* | 12/2017 | Teder | F21V 14/065 |
| 10,914,439 B2* | 2/2021 | Campetella | F21V 9/40 |
| 2011/0280018 A1* | 11/2011 | Vissenberg | G02B 26/0883 |
| | | | 362/277 |
| 2012/0081901 A1* | 4/2012 | Tsang | F21V 9/30 |
| | | | 362/277 |
| 2015/0131288 A1* | 5/2015 | Zhang | F21S 8/00 |
| | | | 362/277 |
| 2017/0082254 A1* | 3/2017 | Zhang | F21V 13/02 |
| 2017/0268749 A1* | 9/2017 | Pet | F21V 14/06 |

* cited by examiner

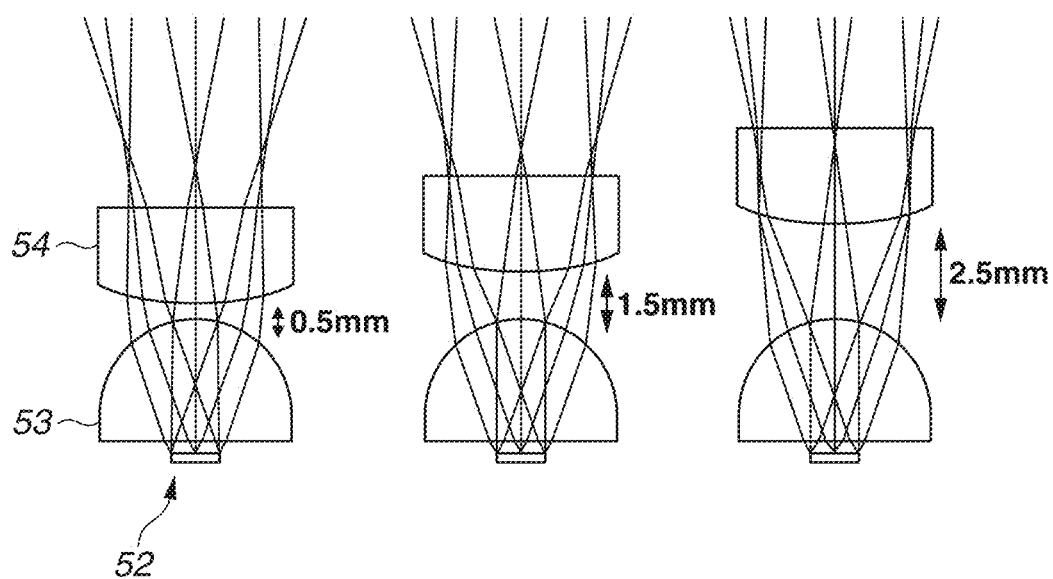

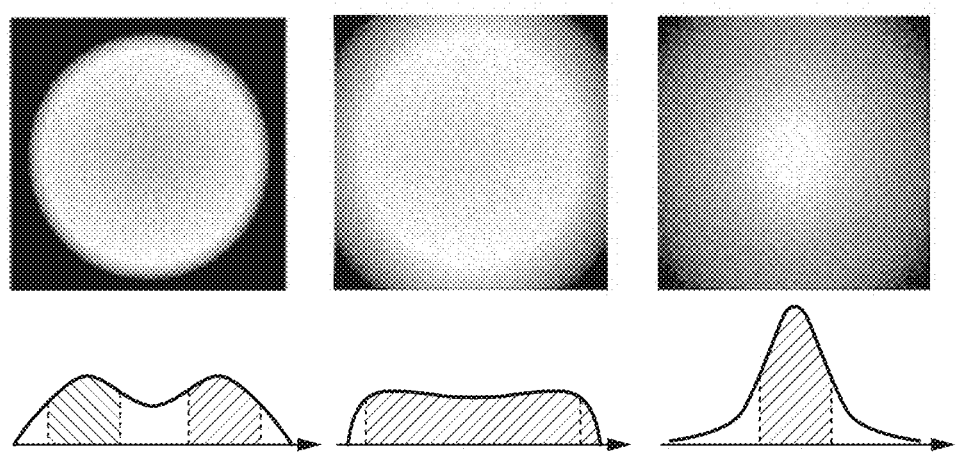

ILLUMINATION APPARATUS HAVING PLANAR ARRAY OF LEDS AND MOVABLE PAIR OF LENS ARRAYS FOR MODIFYING LIGHT OUTPUT

BACKGROUND

Field of the Disclosure

The present disclosure relates to a light source device, an illumination apparatus, an exposure apparatus, and a method for manufacturing an article.

Description of the Related Art

In the step of manufacturing a semiconductor device or a flat panel display (FPD), an exposure apparatus is used. In a lithography step, the exposure apparatus transfers the pattern of an original (a reticle or a mask) onto a photosensitive substrate (a wafer or a glass plate with a resist layer formed on its surface) through a projection optical system.

As a light source of a projection exposure apparatus, for example, a mercury lamp is used. In recent years, the replacement of the mercury lamp with a light-emitting diode (LED), which saves energy, is expected. In the LED, the time from when a current is applied to a substrate circuit that controls light emission to when the output of light becomes stable is short. Thus, the LED does not need to always emit light as in the mercury lamp, and therefore has a long life as well.

Light output per LED, however, is extremely smaller than that of the mercury lamp. Thus, in a case where the LED is used instead of the mercury lamp as the light source, it is necessary to make the total output of light great using an LED array in which a plurality of LEDs is aligned on a substrate.

Japanese Patent Application Laid-Open No. 2018-22884 discusses a technique for differentiating the placement angles of a plurality of LED elements, thereby making light and dark on an irradiation target plane inconspicuous.

Japanese Patent Application Laid-Open No. 2001-350426 discusses a technique for driving a fly-eye lens in an image display device such as a liquid crystal projector, thereby changing the illuminance distribution on an image forming element.

The technique discussed in Japanese Patent Application Laid-Open No. 2018-22884 is aimed at uniformizing the light amount distribution on the irradiation target plane, and therefore cannot adjust the light intensity distribution on the irradiation target plane to a desired distribution other than the uniform distribution.

In Japanese Patent Application Laid-Open No. 2001-350426, a parabolic light collection mirror creates parallel light. The intensity of light incident on the fly-eye lens, however, differs from place to place in the fly-eye lens. Thus, when the fly-eye lens is driven, a change in the light amount distribution on an irradiation target plane is insensitive. With such a configuration, it is difficult to adjust the light amount distribution on the irradiation target plane to a desired distribution.

SUMMARY

According to an aspect of the present invention, a light source device that includes a light-emitting diode (LED) array in which a plurality of LED chips is arranged and forms on a predetermined plane a light intensity distribution obtained by superimposing light intensity distributions of light from the plurality of LED chips includes a pair of lens arrays comprising a plurality of lenses configured to collect light from the plurality of LED chips, wherein a distance between the pair of lens arrays is changed, thereby changing the light intensity distribution to be formed on the predetermined plane.

Further features of the present invention will become apparent from the following description of exemplary embodiments with reference to the attached drawings.

BRIEF DESCRIPTION OF THE DRAWINGS

FIGS. 7A, 7B, and 7C are diagrams of rays when a distance between lens arrays is changed.

FIGS. 8A, 8B, and 8C are diagrams illustrating a light intensity distribution when the distance between the lens arrays is changed.

DESCRIPTION OF THE EMBODIMENTS

Exemplary embodiments of the present invention will be described in detail below based on the attached drawings.

Figure 1:
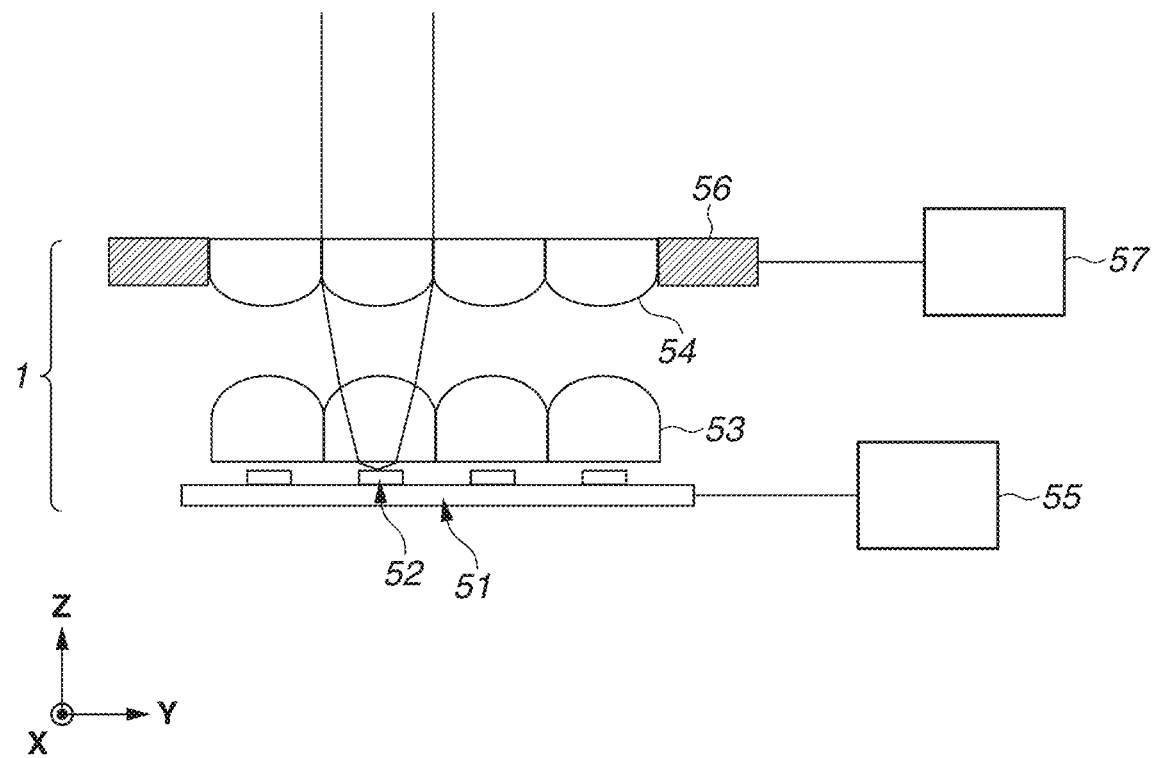
FIG. 1 is a schematic cross-sectional view of a light source unit.

With reference to FIG. 1, a light source unit (light source device) 1 is described. FIG. 1 is a schematic cross-sectional view of the light source unit 1. The light source unit 1 includes a substrate 51, light-emitting diode (LED) chips 52, lens arrays 53 and 54, a control unit 55, a supporting portion 56, and a driving unit 57. On the substrate 51, the plurality of LED chips 52 is placed and referred to as an "LED array unit". On the substrate 51, a circuit for driving the LED chips 52 is formed. If a current is applied to the circuit, each LED chip 52 outputs light of a predetermined wavelength. The control unit 55 controls the current flowing through the LED chips 52, thereby controlling the luminances (intensities) of the light to be output from the LED chips 52.

The lens arrays 53 and 54 are a pair of lens arrays including lenses provided corresponding to the LED chips 52. The lenses of the lens array 53 are provided above the respective LEDs. Each lens may be a plano-convex lens as in FIG. 1, or may have a shape with another type of power. As each of the lens array 53 and 54, a lens array in which lenses are continuously formed by melt molding, etching, or cutting, or a lens array in which individual lenses are joined together can be used. Light emitted from each LED chip 52 spreads at a half angle of about 50° to 70°, but is collected by the lens array 53, further collected by the lens array 54, and converted to spread at about 30° or less. The lens array 53 may be provided a predetermined distance away from the LED chips 52 and fixed integrally with the substrate 51.

Figure 2:
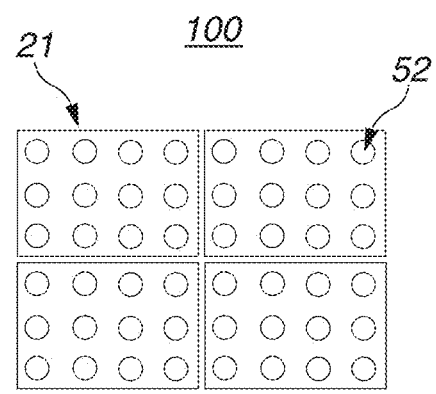
FIG. 2 is a plan view of a light-emitting diode (LED) array.

Next, an LED array included in the light source unit 1 is described. FIG. 2 illustrates an example of the LED array. FIG. 2 is a plan view of an LED array 100. The LED array 100 includes four sub-units (LED groups) 21 in each of which a total of twelve LED chips 52 are arranged in three rows and four columns on the substrate 51. Each of the LED chips 52 provided in each sub-unit has a circular shape.

The control unit 55 may control the output of each LED chip 52. Alternatively, a circuit can also be designed such that the control unit 55 can collectively control the outputs of the plurality of LED chips 52.

The supporting portion 56 is a mechanism that movably supports the lens array 54. The driving unit 57 includes an actuator connected to the supporting portion 56, and a driving circuit of the actuator. The actuator of the driving unit 57 drives the supporting portion 56 and the lens array 54 to move, thereby changing the distance between the lens arrays 53 and 54. The driving unit 57 may be controlled by the control unit 55, or may be controlled by another control unit. Alternatively, the lens array 54 may not be moved, and the substrate 51, the LED chips 52, and the lens array 53 may be integrally moved. Yet alternatively, both the lens arrays 53 and 54 may be configured to be movable.

The plurality of LED chips 52 is discretely arranged on an XY plane, and condenser lenses of the lens array 53 are provided corresponding to the LED chips 52. That is, the lenses of the lens arrays 53 and 54 are also arranged on the XY plane. Light from the LED chips 52 is collected by the lenses of the lens arrays 53 and 54, and the collected light is emitted in a Z-axis direction. In the present exemplary embodiment, the distance between the lens arrays 53 and 54 is defined by a distance in the Z-axis direction.

Figure 3:
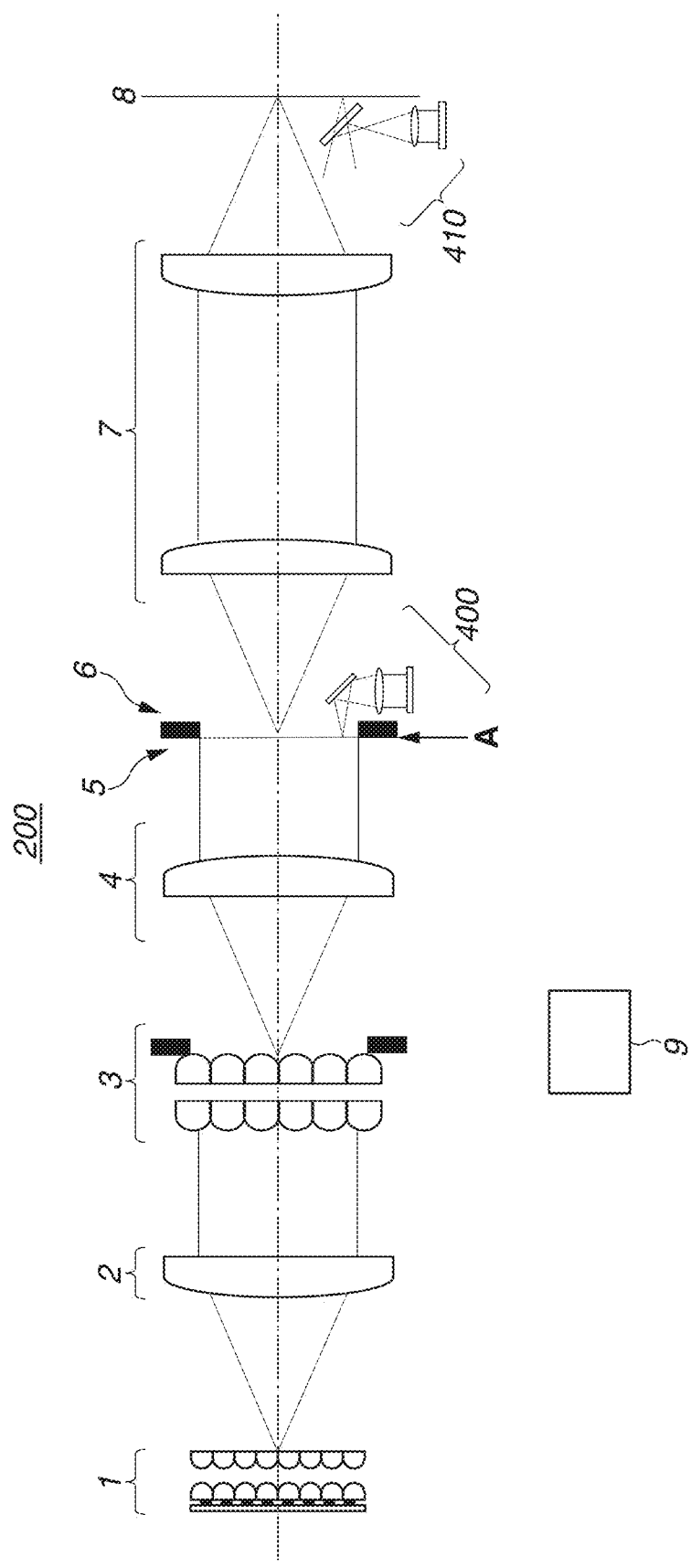
FIG. 3 is a schematic diagram of an illumination optical system.

With reference to FIG. 3, an example of an illumination optical system (an illumination apparatus) is described. FIG. 3 is a schematic cross-sectional view of the illumination optical system. An illumination optical system 200 includes the light source unit 1, a condenser lens 2, a fly-eye optical system 3, a condenser lens 4, a field-of-view stop 6, and an image forming optical system 7.

A beam emitted from the light source unit 1 passes through the condenser lens 2 and reaches the fly-eye optical system 3. The condenser lens 2 is designed such that the position of the exit surface of the light source unit 1 and the position of the entrance surface of the fly-eye optical system 3 are optically Fourier conjugate planes. Such an illumination system is termed Köhler illumination. Although a single plano-convex lens is illustrated as the condenser lens 2 for simplicity in FIG. 3, actually, the condenser lens 2 often includes a plurality of lens groups.

Figure 4:
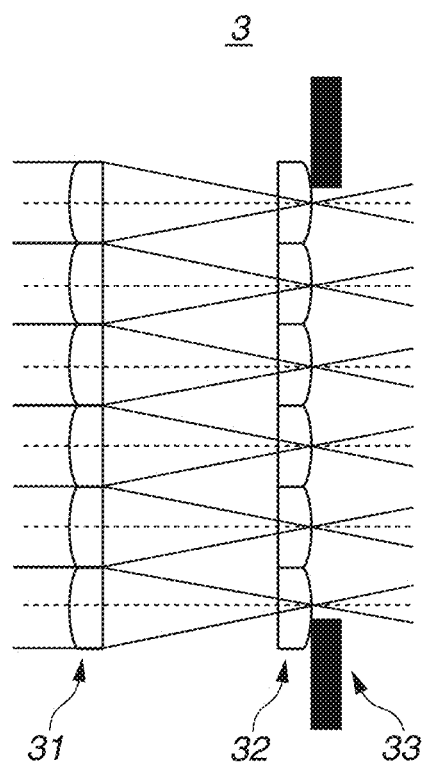
FIG. 4 is a schematic diagram of a fly-eye optical system.

FIG. 4 illustrates a schematic cross-sectional view of the fly-eye optical system 3. The fly-eye optical system 3 includes two lens groups 31 and 32 and an aperture stop 33. Each of the lens groups 31 and 32 is a lens group in which a plurality of plano-convex lenses is bonded together such that the edge surfaces of the plano-convex lenses have the same planar shapes. The lens groups 31 and 32 are placed such that at the focal position of each individual plano-convex lens, a counterpart plano-convex lens is located. Using such a fly-eye optical system 3, at the position of the exit surface of the fly-eye optical system 3, a plurality of secondary light source images conjugate to the exit surface of the light source unit 1 is formed.

Figure 5:
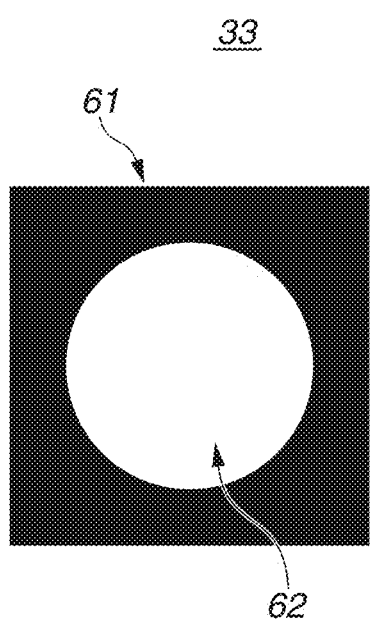
FIG. 5 is a diagram illustrating an aperture stop.

Near the lens groups 31 and 32 of the fly-eye optical system 3, the aperture stop 33 illustrated in FIG. 5 is formed.

The aperture stop 33 includes a portion 62 (an aperture) that transmits light, and a portion 61 that blocks light. Light emitted from the exit surface of the fly-eye optical system 3 and having passed through the light transmission portion 62 of the aperture stop 33 passes through the condenser lens 4 and reaches an illumination plane 5.

The condenser lens 4 is designed such that the exit surface of the fly-eye optical system 3 and the illumination plane 5 are optically Fourier conjugate planes. The exit surface of the fly-eye optical system 3 or the plane conjugate to the exit surface of the fly-eye optical system 3 is the pupil plane of the illumination optical system 200. In this case, the light intensity distributions of light from secondary light sources formed on the exit surface of the lens group 32 are summed up in a superimposed manner on the illumination plane 5 and thereby can create an almost uniform light intensity distribution. The fly-eye optical system 3 has the function of uniformizing a light intensity distribution and is termed an optical integrator. Examples of the optical integrator include a microlens array and a fly-eye lens. As the optical integrator, a lens array in which lenses are continuously formed by etching, or a lens array in which individual lenses are joined together can be used.

Near the illumination plane 5, the field-of-view stop 6 is placed. An image of a beam emitted from an aperture portion of the field-of-view stop 6 is formed on an illumination target plane 8 by the image forming optical system 7. The image forming optical system 7 has a desired magnification, and an illumination area cut out by the field-of-view stop 6 is projected onto the illumination target plane 8.

Figure 6A:
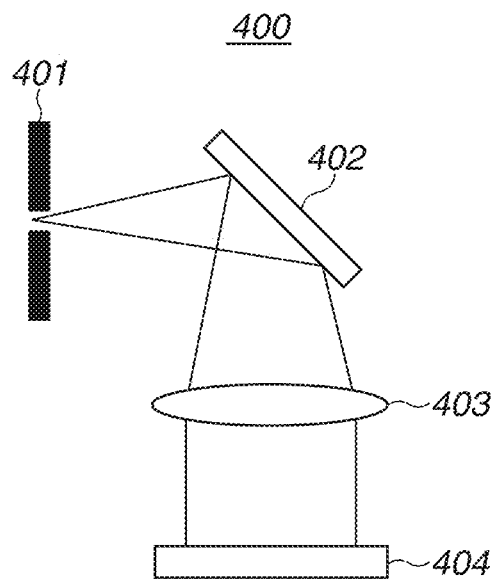
FIGS. 6A and 6B are schematic diagrams of measurement units.

The illumination optical system 200 includes a measurement unit (measuring instrument) 400 that measures the light intensity distribution on the pupil plane (the pupil intensity distribution). The measurement unit 400 is placed in the optical path when making measurements and measures the pupil intensity distribution. FIG. 6A illustrates a schematic diagram of the measurement unit 400. The measurement unit 400 is placed on the back side of the pupil plane (e.g., an A-plane) on which the intensity distribution should be measured. Then, the measurement unit 400 detects a part of a beam incident on the A-plane. Near the A-plane, a pinhole plate 401 having a pinhole is placed, and a beam emitted with a certain angle distribution from the pinhole plate 401 is bent 90° by a deflecting mirror 402. Then, the beam is refracted by a lens 403 having positive power and is converted into almost parallel light. The almost parallel light is incident on a detector 404 such as a charge-coupled device (CCD) camera. A light distribution detected by the detector 404 is converted into an electric signal, and the electric signal is imported into a data processing apparatus such as a computer.

Figure 6B:
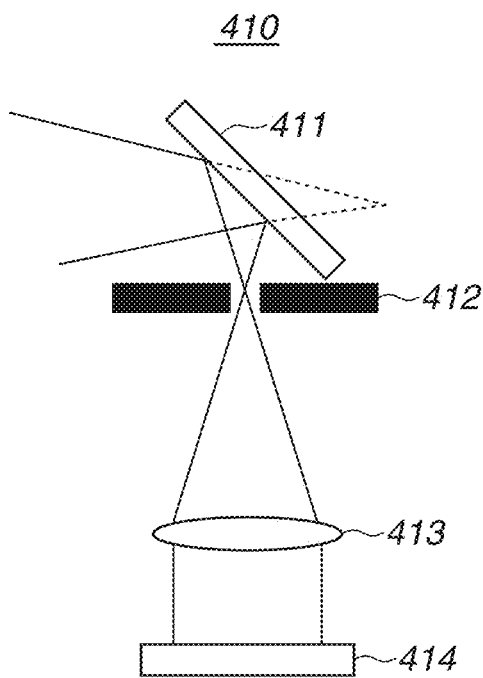

Alternatively, a measurement unit 410 that measures the pupil intensity distribution may be placed on the front side of the illumination target plane 8 and a part of a beam incident on the illumination target plane 8 may be detected. FIG. 6B illustrates a schematic diagram of the measurement unit 410. A part of a beam to be incident on the illumination target plane 8 is bent 90° by a deflecting mirror 411 before being incident on the illumination target plane 8. At an optical path length position corresponding to the illumination target plane 8 in a case where the beam is not bent, a pinhole plate 412 having a pinhole is placed. A beam emitted with a certain angle distribution from the pinhole plate 412 is refracted by a lens 413 having positive power and is converted into almost parallel light. The almost parallel light is incident on a detector 414 such as a CCD camera.

The measurement units 400 and 410 are different in the configurations of the optical elements but based on essentially the same principles. If the distances between the pinholes and the CCD surfaces are extremely greater than the diameters of the pinholes, the lenses 403 and 413 can be omitted.

In the present exemplary embodiment, to adjust the light intensity distribution on an irradiation target plane in a predetermined plane to a desired distribution, the distance between the lens arrays 53 and 54 of the light source unit 1 is changed. FIGS. 7A, 7B, and 7C illustrate the states of rays when the distance between the plurality of lens arrays 53 and 54 is changed. Each of FIGS. 7A, 7B, and 7C illustrates a single lens for each lens array. FIG. 7A illustrates the state of a ray in a case where the distance between the plurality of lens arrays 53 and 54 is 0.5 mm FIG. 7B illustrates the state of a ray in a case where the distance between the plurality of lens arrays 53 and 54 is 1.5 mm FIG. 7C illustrates the state of a ray in a case where the distance between the plurality of lens arrays 53 and 54 is 2.5 mm FIGS. 8A, 8B, and 8C illustrate the light intensity distribution on the entrance surface of the fly-eye optical system 3. In each of FIGS. 8A, 8B, and 8C, the center is the optical axis of the illumination optical system 200, and each of FIGS. 8A, 8B, and 8C illustrates the light intensity distribution at a cross section passing through the optical axis. FIG. 8A illustrates the light intensity distribution in a case where the distance between the plurality of lens arrays 53 and 54 is 0.5 mm FIG. 8B illustrates the light intensity distribution in a case where the distance between the plurality of lens arrays 53 and 54 is 1.5 mm FIG. 8C illustrates the light intensity distribution in a case where the distance between the plurality of lens arrays 53 and 54 is 2.5 mm. The length of each LED chip 52 in a horizontal direction in FIGS. 7A, 7B, and 7C was about 2 mm, the length of the lower surface of each lens of the lens array 53 was about 5 mm, the curvature of the lens array 53 was set to a predetermined value, and a ray and the light intensity distribution were obtained by optical simulation.

As illustrated in FIGS. 7C and 8C, light is shifted close to the center of the optical axis, and a light intensity distribution having a peak in a center area (small 6) is formed. If the distance between the lens arrays 53 and 54 becomes smaller, a ray near the center of the optical axis moves outward. Then, in the case of FIGS. 7B and 8B, an almost flat light intensity distribution (large 6) is formed. If the distance between the lens arrays 53 and 54 becomes even smaller, the ray near the center of the optical axis moves further outward, and an annular light intensity distribution that is dark in the center and has a peak in an area outside the center is formed. These light intensity distributions, however, are examples, and the results differ depending on the angle distribution of light emitted from the LED chip 52.

If a target light intensity distribution (a target illumination mode) on the irradiation target plane, such as the small 6, large 6, or annular light intensity distribution, is set, a control unit 9 of the illumination optical system 200 drives the actuator of the driving unit 57 to obtain the target light intensity distribution, thereby changing the distance between the lens arrays 53 and 54. This can change the light intensity distribution on the irradiation target plane to the small σ, large σ, or annular light intensity distribution. Alternatively, the control unit 9 of the illumination optical system 200 may set a target intensity distribution, and based on the pupil intensity distribution measured by a measurement unit, control the distance between the lens arrays 53 and 54 such that the actual pupil intensity distribution is the target intensity distribution.

By thus controlling the distance between the plurality of lens arrays according to the present exemplary embodiment, it is possible to adjust the light intensity distribution on a predetermined plane or the pupil plane of an illumination optical system to a desired intensity distribution.

Figure 9A:
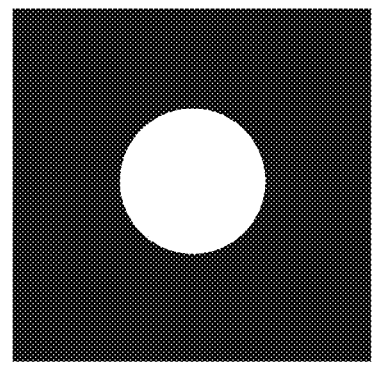
FIGS. 9A and 9B are diagrams illustrating examples of the aperture stop.
Figure 9B:
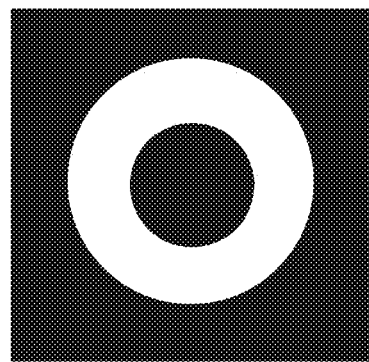

Further, according to a change in the pupil intensity distribution by changing the distance between the lens arrays 53 and 54, the field-of-view stop 6 may be changed. In a case where the light intensity distribution for small σ illustrated in FIG. 8C is formed, a field-of-view stop having an aperture for small σ illustrated in FIG. 9A can be placed near the exit surface of the fly-eye optical system 3. In a case where the annular light intensity distribution illustrated in FIG. 8A is formed, a field-of-view stop having an annular aperture illustrated in FIG. 9B can be placed near the exit surface of the fly-eye optical system 3, thereby switching field-of-view stops.

Figure 10:
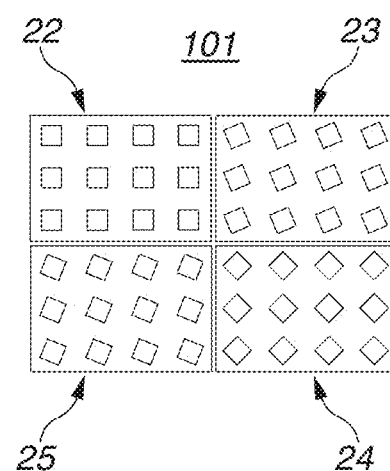
FIG. 10 is a plan view of an LED array.

Next, another example of the LED array is described. FIG. 10 is a plan view of an LED array 101. The LED array 101 includes sub-units 22, 23, 24, and 25. In the sub-unit 22, a total of twelve LED chips are arranged in three rows and four columns on a substrate. Each LED has an approximately square shape, and the placement angles of the LEDs are the same as one another. Also in each of the sub-units 23, 24, and 25, a total of twelve LED chips are arranged in three rows and four columns on the substrate. In the sub-unit 24, the mounted LED chips are placed inclined about 45° relative to those of the sub-unit 22. The sub-units 23 and 25 are sub-units in which the LED chips are placed inclined −22.5° and +22.5° relative to the LED chips of the sub-unit 22. As described above, the placement angles of a plurality of LED chips in a single sub-unit (in a single LED group) are the same as those of one another. The placement angles of LED chips are differentiated between a plurality of sub-units (between a plurality of LED groups). In each sub-unit, the LED chips are arranged in three rows and four columns, but may be placed in rows and columns other than three rows and four columns. For example, an LED array may include two LED chips having different placement angles from each other. However, it can be said to be desirable to configure a single sub-unit with a plurality of LED arrays that is somewhat unified, because it is easier to design a circuit. Further, the placement angles can be not only 0°, 22.5°, and 45°, but also various angles. The control unit 55 may control the output of each LED chip. The control unit 55 may collectively control the outputs of a plurality of LED chips included in a single sub-unit, thereby controlling the outputs of the LEDs with respect to each sub-unit.

Figure 11A:
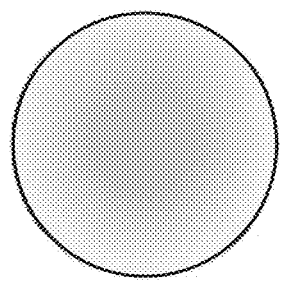
FIGS. 11A, 11B, and 11C are diagrams illustrating a light intensity distribution.

If the LED array 101 is configured as the light source unit 1, the pupil intensity distribution is as illustrated in FIG. 11A. In each of FIGS. 11A, 11B, and 11C, a circle indicated by a solid line is a circle corresponding to the effective diameter of the pupil plane of the illumination optical system 200. That is, an intensity distribution inside the circle corresponds to an angle distribution for illuminating a certain point on the illumination target plane 8. The distribution is a light intensity distribution obtained by combining light from the LED chips of the sub-units 22, 23, 24, and 25. The intensities of light from the LED chips of the sub-unit 22 are stronger in oblique directions than in vertical and horizontal directions in a plane, and the light forms a distribution in which a difference in intensity occurs between directions (azimuthal directions). This is because the shape of each LED chip is square, and therefore, the outer shape of the LED chip is partially projected. The intensities of light from the LED chips of the sub-unit 24, which are placed inclined about 45°, are stronger in the vertical and horizontal directions than in the oblique directions in the plane, and the light forms a distribution in which a difference in intensity occurs between directions (azimuthal directions). As described above, a light intensity distribution having different angles to a certain axis in a plane according to the placement angles of the LED chips is formed. The distribution is a light intensity distribution obtained by adding light from the sub-units 23 and 25, in which the chips are placed inclined +22.5° and −22.5°, to light from the sub-units 22 and 24. By thus differentiating the placement angles of the LED chips from each other, it is possible to form a light intensity distribution in which the difference (deviation) in intensity between azimuthal directions in a plane, such as the vertical and horizontal directions and the oblique directions, is small.

Figure 11B:
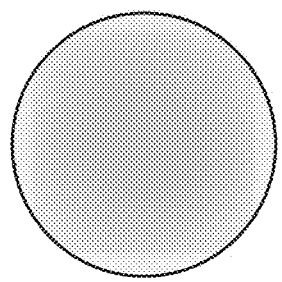
Figure 11C:
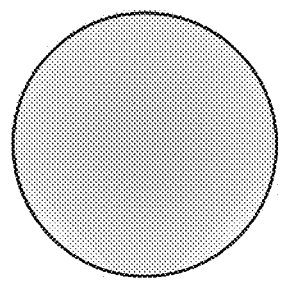

In the present exemplary embodiment, in a case where, for example, the LED array 101 is configured as the light source unit 1, it is possible to control the sub-units 22, 23, 24, and 25 such that the intensity of light emitted from the sub-unit 22 is higher than the intensities of light emitted from the other sub-units 23, 24, and 25. Specifically, the sub-units 22, 23, 24, and 25 are controlled such that a current flowing through the LED chips of the sub-unit 22 is greater than currents flowing through the LED chips of the other sub-units 23, 24, and 25. At this time, it is possible to change a current flowing through all or some of the LED chips of the sub-unit 22. As a result, the pupil intensity distribution is a distribution as illustrated in FIG. 11B. That is, the pupil intensity distribution is a distribution in which a greater difference in intensity between the vertical and horizontal directions and the oblique directions than in the distribution in FIG. 11A occurs. In a case where the LED chips are controlled such that the intensities of light emitted from the sub-units 23, 24, and 25 of the LED array 101 are higher than the intensity of light emitted from the sub-unit 22, the pupil intensity distribution is a distribution illustrated in FIG. 11C.

By thus controlling the output of the LED array according to the present exemplary embodiment, it is possible to adjust the light intensity distribution on a predetermined plane or the pupil plane of an illumination optical system to a desired intensity distribution. A control unit of the illumination optical system may set a target intensity distribution, and based on an intensity distribution measured by a measurement unit, control the outputs of LEDs of the LED array such that the actual pupil intensity distribution is the target intensity distribution.

Figure 12:
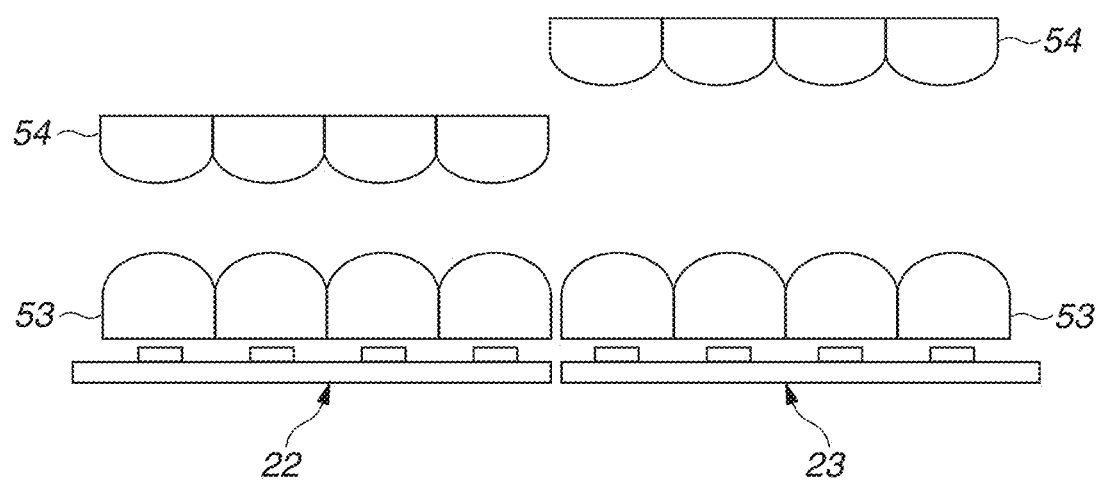
FIG. 12 is a diagram illustrating movements of lens array sub-units.

In the above example, when the distance between the lens arrays 53 and 54 of the light source unit 1 is changed, the entirety of the lens array 54 is moved. Alternatively, each of lens array sub-units corresponding to the LED sub-units may be moved. For example, the lens array 54 is composed of four lens array sub-units corresponding to the LED sub-units 22, 23, 24, and 25, and each lens array sub-unit is configured to be independently movable. For example, as illustrated in FIG. 12, a lens array sub-unit (a first lens array) composed of lenses that collect light from the LEDs of the LED sub-unit 22 (a first LED array) is configured. A lens array sub-unit (a second lens array) composed of lenses that collect light from the LEDs of the LED sub-unit 23 (a second LED array) is configured. Then, at least one of the first and second lens arrays is configured to be movable. The plurality of lens array sub-units is moved relative to each other, thereby differentiating the distances from the lens array 53. Also in the lens array 53, lens array sub-units corresponding to the LED sub-units 22, 23, 24, and 25 may be configured, and the position of each lens array sub-unit may be individually controlled. In a case where each sub-unit of the lens array 53 is moved, the LED chips may also be moved integrally with the sub-unit.

The light source device and the illumination optical system can be applied to various illumination apparatuses, and can also be used for an apparatus that illuminates a light-curing composition, an apparatus that illuminates and examines an object to be examined, or a lithography apparatus. For example, the light source device and the illumination optical system can be applied to an exposure apparatus that exposes the pattern of a mask on a substrate, a maskless exposure apparatus, an imprint apparatus that forms a pattern on a substrate using a mold, or a planarized layer forming apparatus that planarizes resin using a flat plate.

Figure 13:
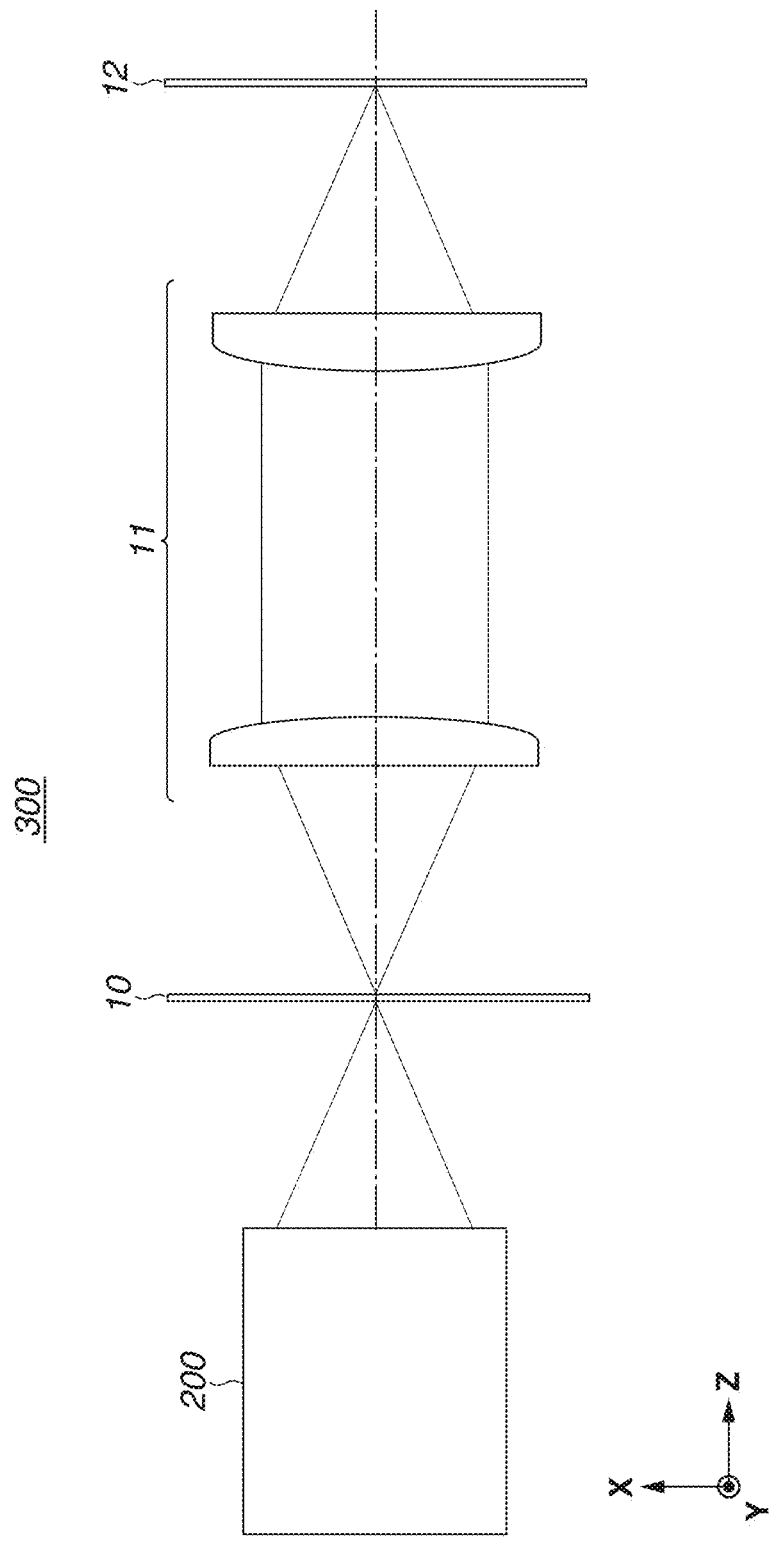
FIG. 13 is a schematic diagram of an exposure apparatus.

Next, with reference to FIG. 13, an example of the exposure apparatus is described. FIG. 13 illustrates a schematic diagram of the exposure apparatus. An exposure apparatus 300 includes the illumination optical system 200 that illuminates a photomask 10, and a projection optical system 11 that projects the pattern of the photomask 10 onto a wafer 12. The projection optical system 11 may be a projection lens composed of a lens, or may be a reflective projection system using a mirror. Although not illustrated in FIG. 13, stages that hold and drive the photomask 10 and the wafer (substrate) 12 are used.

Near the illumination target plane 8 of the illumination optical system 200, the photomask 10 is placed. On the photomask 10, a minute pattern is formed of a metal film such as chromium. Illuminating light emitted to the photomask 10 is diffracted according to the pattern of the photomask 10. An image of the diffracted light is formed on the wafer 12 by the projection optical system 11 (an exposure unit).

The angle distribution of a beam incident on a certain single point on the photomask 10 corresponds to the light intensity distribution on the pupil plane of the illumination optical system 200 and influences the image forming performance of the exposure apparatus 300. For example, if the pupil intensity distribution is small 6, and the line width and the period of the pattern of a mask becomes small, the line width of a pattern image to be formed on a substrate becomes small, or the pattern image cannot be resolved. If an annular intensity distribution is used, it is possible to faithfully form an image of a pattern having a more minute line width on a substrate.

The actual image forming performance of the exposure apparatus 300 can be affected by many influence factors other than the pupil intensity distribution of the illumination optical system 200. Examples of the influence factors include the aberration and the pupil intensity distribution of the projection optical system 11, the vibration of the exposure apparatus 300, the influence of heat, and the influence of an exposure process. The image forming performance is determined by summing up these factors in a complex manner. In response, the deterioration of the image forming performance occurring due to a factor other than the pupil intensity distribution of the illumination optical system 200 can be corrected by changing the pupil intensity distribution of the illumination optical system 200 to a desired distribution. In the present exemplary embodiment, the pupil intensity distribution can be changed by changing the distance between the plurality of lens arrays or changing the outputs of the LEDs.

The adjustment amount of the pupil intensity distribution may be determined by trial and error, repeating adjustments and the measurements of the image forming characteristic of a pattern, or may be determined by image simulation in view of the characteristic of a photosensitive material of the wafer 12 or other process conditions. Alternatively, the relationship between the distance between the plurality of lens arrays and the image forming performance of a pattern to be projected onto the wafer 12 may be acquired with respect to each type (line width, period, direction, or shape) of pattern. Yet alternatively, the relationship between the value of a current to be applied to or the amount of light to be emitted from the LED chips of each sub-unit, and the image forming performance of a pattern to be projected onto the wafer 12 may be acquired with respect to each type (line width, period, direction, or shape) of pattern. Consequently, according to the pattern of a mask to be actually used, it is possible to change the distance between the plurality of lens arrays or change the outputs of the LEDs. Thus, it is possible to adjust the image forming performance for various patterns.

As described above, based on the exposure apparatus according to the present exemplary embodiment, it is possible to adjust the image forming performance of various patterns by controlling the pupil intensity distribution to be a desired distribution using an LED array.

Figure 14:
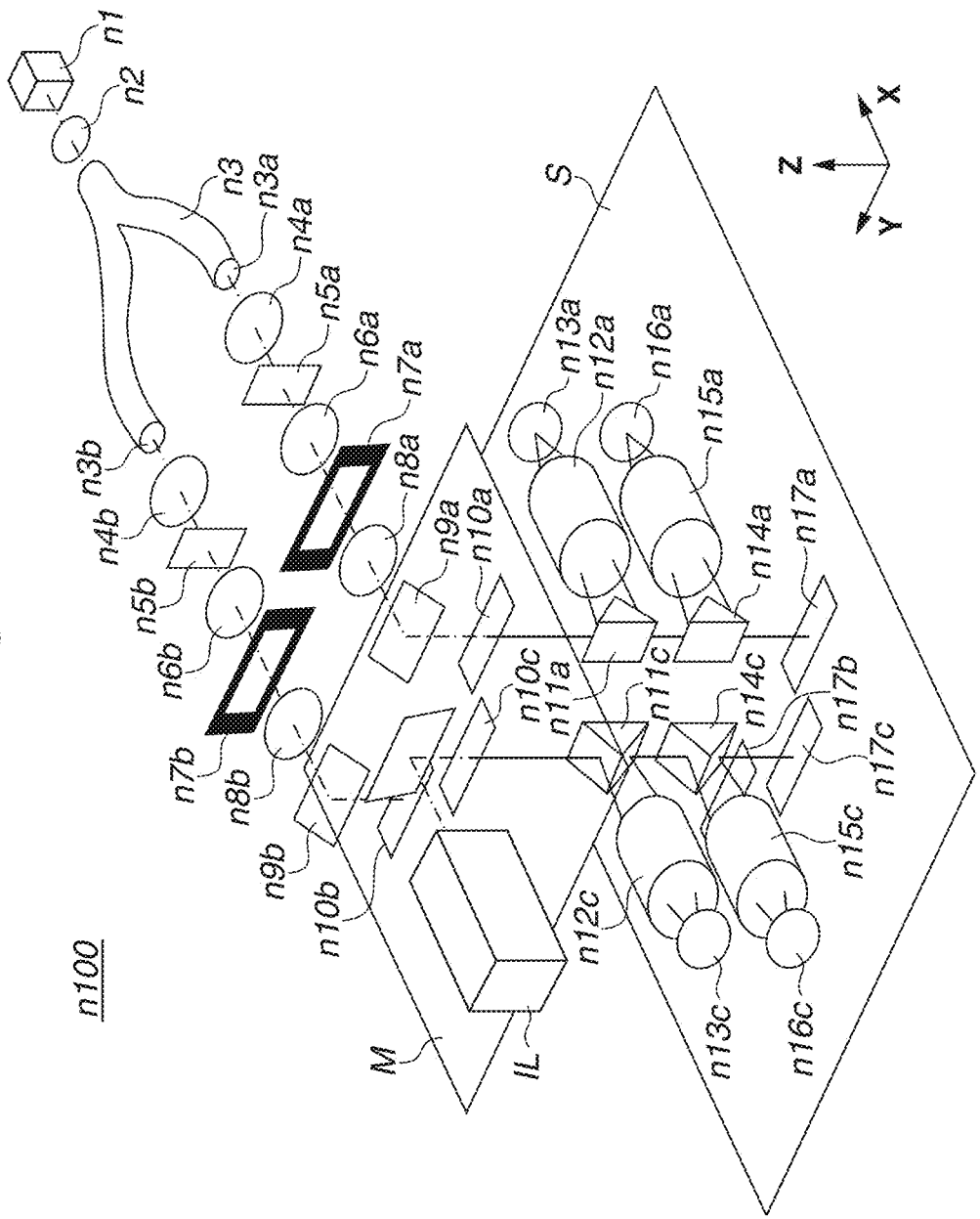
FIG. 14 is a diagram illustrating another example of the exposure apparatus.

FIG. 14 illustrates another example of the exposure apparatus. An exposure apparatus n100 in FIG. 14 includes illumination optical systems that illuminate a mask M, and a projection optical system that projects the pattern of the mask M onto a substrate S. The mask M is movably held by a mask stage, and the substrate S is movably held by a substrate stage.

Using light from a light source n1, the illumination optical systems form on the mask M a plurality of illumination areas n10a, n10b, and n10c arranged along a Y-direction.

As the light source n1, the light source unit 1 including the LED array can be applied. Light from the light source n1 passes through a lens n2 and is incident on the entrance end of a light guide n3. The light guide n3 is composed of randomly bundled optical fibers and forms a uniform light intensity distribution at each of its exit ends n3a and n3b. A beam emitted from the exit end n3a of the light guide n3 passes through a relay lens n4a and is incident on a fly-eye lens n5a. On the exit surface side of the fly-eye lens n5a, a plurality of secondary light sources is formed. Light from the plurality of secondary light sources passes through a condenser lens n6a provided such that its front focus is located at the positions where the secondary light sources are formed. Then, the light uniformly illuminates a field-of-view stop n7a having a rectangular aperture portion. Light from the aperture portion of the field-of-view stop n7a passes through a relay optical system n8a, the optical path of the light is deflected 90 degrees by a mirror n9a, and the light illuminates the mask M. The relay optical system n8a is an optical system that optically conjugates the field-of-view stop n7a and the mask M. The relay optical system n8a forms the illumination area n10a that is an image of the aperture portion of the field-of-view stop n7a.

A beam emitted from the exit end n3b of the light guide n3 passes through a relay lens n4b and is incident on a fly-eye lens n5b. On the exit surface side of the fly-eye lens n5b, a plurality of secondary light sources is formed. Light from the plurality of secondary light sources passes through a condenser lens n6b provided such that its front focus is located at the positions where the secondary light sources are formed. Then, the light uniformly illuminates a field-of-view stop n7b having a rectangular aperture portion. Light from the aperture portion of the field-of-view stop n7b passes through a relay optical system n8b, the optical path of the light is deflected 90 degrees by a mirror n9b, and the light illuminates the mask M. The relay optical system n8b is an optical system that optically conjugates the field-of-view stop n7b and the mask M. The relay optical system n8b forms the illumination area n10b that is an image of the aperture portion of the field-of-view stop n7b.

An illumination optical system IL that forms the illumination area n10c can also be composed of an optical system similar to the above. The exit ends of the light guide n3 are provided corresponding to the number of illumination areas, and illuminating light is supplied to these illumination areas from the exit ends of the light guide n3 through the plurality of illumination optical systems. The aperture portion of each field-of-view stop is not limited to a rectangular shape, and may have a trapezoidal or rhomboidal shape. The number of illumination areas is not limited to three, and may be four or more.

In this example, a single light source n1 is used in front of the light guide n3. Alternatively, light sources n1 (light source units 1) may be placed in front of respective relay lenses such as the relay lens n4a without using the light guide n3. That is, a single light source may be used for a single illumination optical system. In this case, by independently moving lens arrays in the light source units 1, it is possible to independently adjust the light intensity distributions on the pupil planes of the illumination optical systems.

Next, the projection optical system is described. The projection optical system includes as many projection optical system modules as the number of illumination areas to be formed by the illumination optical systems and is composed of an optical system for an equal-magnification and erected normal image. The configurations of the projection optical system modules are the same as each other. Each projection optical system module has a configuration obtained by combining two Dyson optical systems (a first partial optical system and a second partial optical system).

Each partial optical system includes a right angle prism having a reflective surface placed at an inclination of 45° facing the mask M, a lens group having an optical axis along the in-plane direction of the mask M, and a spherical mirror that reflects light having passed through the lens group.

The optical path of light from the illumination area n10a having passed through the mask M is deflected 90° by a right angle prism n11a, and the light is incident on a lens group n12a. The light from the right angle prism n11a is refracted by the lens group n12a and reaches and is reflected by a spherical mirror n13a. The reflected light passes through the lens group n12a and reaches the right angle prism n11a. The optical path of the light from the lens group n12a is deflected 90° by the right angle prism n11a, and the light forms a primary image of the mask M on the exit surface side of the right angle prism n11a. The primary image of the mask M formed by the first partial optical system at this time is an equal-magnification image with a positive lateral magnification in an X-direction and a negative lateral magnification in the Y-direction.

Light from the primary image passes through the second partial optical system and forms a secondary image of the mask M on the surface of the substrate S. The configuration of the second partial optical system is the same as that of the first partial optical system. The optical path of the light is deflected 90° by a right angle prism n14a, and the light is incident on a lens group n15a. The light from the right angle prism n14a is refracted by the lens group n15a and reaches and is reflected by a spherical mirror n16a. The reflected light passes through the lens group n15a and reaches the right angle prism n14a. The optical path of the light from the lens group n15a is deflected 90° by the right angle prism n14a, and the light forms a secondary image of the mask M on the exit surface side of the right angle prism n14a. Similarly to the first partial optical system, the second partial optical system forms an equal-magnification image with a positive lateral magnification in the X-direction and a negative lateral magnification in the Y-direction. Thus, the secondary image formed on the substrate S is an equal-magnification and erect image of the mask M, and an exposure area n17a is formed.

Also regarding the illumination area n10c, similarly, the optical path of light is deflected 90° by a right angle prism n11c, and the light is incident on a lens group n12c. The light from the right angle prism n11c is refracted by the lens group n12a and reaches and is reflected by a spherical mirror n13c. The reflected light passes through the lens group n12c and reaches the right angle prism n11c. The optical path of the light from the lens group n12c is deflected 90° by the right angle prism n11c, and the light forms a primary image of the mask M on the exit surface side of the right angle prism n11c. Then, the optical path of the light is deflected 90° by a right angle prism n14c, and the light is incident on a lens group n15c. The light from the right angle prism n14c is refracted by the lens group n15c and reaches and is reflected by a spherical mirror n16c. The reflected light passes through the lens group n15c and reaches the right angle prism n14c. The optical path of the light from the lens group n15c is deflected 90° by the right angle prism n14c, and the light forms a secondary image of the mask M on the exit surface side of the right angle prism n14c. An exposure area n17c is formed on the substrate S.

Also regarding the illumination area n10b, an image is projected onto the substrate S by a projection optical system module having a similar configuration, and an exposure area n17b is formed on the substrate S. Consequently, the projection optical system modules form on the substrate S the three exposure areas n17a, n17b, and n17c arranged along the Y-direction.

The exposure apparatus n100 moves the mask M and the substrate S relative to each other in the X-axis direction, thereby performing scanning exposure on the substrate S. The substrate S is exposed by the exposure areas n17a, n17b, and n17c, and the side end portions of the exposure areas overlap each other by the exposure areas n17a, n17b, and n17c. Thus, it is possible to expose the substrate S without space.

As the light source n1, the light source unit 1 including the LED array is applied, whereby it is possible to adjust the image forming performance of various patterns by controlling the pupil intensity distribution to be a desired distribution.

(Method for Manufacturing Article)

Next, a description is given of a method for manufacturing an article (a semiconductor integrated circuit (IC) element, a liquid crystal display element, a color filter, or a microelectromechanical systems (MEMS)) using the exposure apparatus. The article is manufactured by, using the exposure apparatus, performing the step of exposing a substrate (a wafer or a glass substrate) to which a photosensitizing agent is applied, the step of developing the substrate (the photosensitizing agent), and the step of processing the developed substrate in other known processing steps. The other known steps include etching, resist removal, dicing, bonding, and packaging. According to this manufacturing method, it is possible to manufacture a higher-grade article than a conventional method.

A description is given of a method for manufacturing an article using the imprint apparatus or the planarized layer forming apparatus. The article is manufactured by performing the following steps using the imprint apparatus or the planarized layer forming apparatus including the light source device. The step of bringing a light-curing composition on a substrate into contact with a mold on which a pattern is formed or with a mold without a pattern (a flat plate), the step of curing the light-curing composition by illuminating the light-curing composition using the light source device, and the step of separating the cured composition and the mold from each other are performed. Further, the step of processing in other known processing steps the substrate on which the cured composition is formed is performed. The other known steps include etching, dicing, bonding, and packaging. According to this manufacturing method, it is possible to manufacture a higher-grade article than a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-015844, filed Jan. 31, 2019, which is hereby incorporated by reference herein in its entirety.

What is claimed is:

1. An illumination apparatus comprising:
a light source device that includes a plurality of LED chips arranged to form an LED array, light from the plurality of LED chips superimpose to project a light intensity distribution on a predetermined plane;
an optical system configured to illuminate an illumination target plane using light from the light source device,
a condenser lens; and
an optical integrator,
wherein the light source device includes a pair of lens arrays in which lenses configured to collect light from the plurality of LED chips are provided, at least one of the pair of lens arrays is driven in a direction along an optical axis of the device, and a change in a distance between the pair of lens arrays changes the light intensity distribution projected on the predetermined plane, and
wherein the light intensity distribution obtained by superimposing the light intensity distributions of the light from the plurality of LED chips of the light source device is formed on an entrance surface of the optical integrator through the condenser lens using the light from the light source device.

2. The illumination apparatus according to claim 1, further comprising a control unit configured to change an illumination mode, wherein the distance between the pair of lens arrays of the light source device is changed according to the change in the illumination mode.

3. The illumination apparatus according to claim 1, wherein the optical integrator includes a lens group.

4. The illumination apparatus according to claim 1, wherein the pair of lens arrays are configured to be moved, such that a distance between the lens arrays changes to adjust a position of a peak of the light intensity distribution projected on the predetermined plane.

5. The illumination apparatus according to claim 1, wherein the pair of lens arrays are configured to be moved, such that a distance between the lens arrays changes to adjust the light intensity distribution between a first light intensity distribution having a peak in a center area including the optical axis, and a second light intensity distribution having a peak in an outside area not including the optical axis.

6. The illumination apparatus according to claim 1, further comprising a driving unit configured to move at least one of the pair of lens arrays.

7. The illumination apparatus according to claim 1, further comprising a driving unit configured to move at least one of the pair of lens arrays.

8. The illumination apparatus according to claim 1,
wherein the LED arrays include first and second LED arrays, a first lens array of the pair of lens arrays is configured to collect light from the first LED array, and a second lens array of the pair of lens array is configured to collect light from the second LED array, and
wherein at least one of the first and second lens arrays is moveable.

9. The illumination apparatus according to claim 1, further comprising a control unit configured to individually control an output of the first LED array and the second LED array.

10. An illumination apparatus, comprising:
a light source device that includes a plurality of LED chips arranged to form an LED array, light from the plurality of LED chips arranged to form an LED array, light from the plurality of LED chips superimpose to project a light intensity distribution on a predetermined plane;
an optical system configured to illuminate an illumination target plane using light from the light source device; and
a measuring instrument configured to measure a pupil intensity distribution on a pupil plane of the illumination apparatus,
wherein the light source device includes a pair of lens arrays in which lenses configured to collect light from the plurality of LED chips are provided, at least one of the pair of lens arrays is driven in a direction along an optical axis of the device, and a change in a distance between the pair of lens arrays changes the light intensity distribution projected on the predetermined plane, and
wherein the distance between the pair of lens arrays of the light source device is changed based on the pupil intensity distribution measured by the measuring instrument.

11. An exposure apparatus comprising:
an illumination apparatus including a light source device that includes a plurality of LED chips arranged to form an LED array, light from the plurality of LED chips superimpose to project a light intensity distribution on a predetermined plane, and an optical system configured to illuminate an illumination target plane using light from the light source device, the illumination apparatus configured to illuminate a mask; and
an exposure unit configured to expose a pattern of the mask on a substrate,
wherein the light source device includes a pair of lens arrays in which lenses configured to collect light from the plurality of LED chips are provided, and changes a distance between the pair of lens arrays, thereby changing the light intensity distribution projected on the predetermined plane.

12. The exposure apparatus according to claim 11, wherein the distance between the pair of lens arrays of the light source device is changed based on an image forming characteristic of the pattern.

13. The exposure apparatus according to claim 11, wherein at least one of the pair of lens arrays is driven in a direction along an optical axis of the device, and a change in a distance between the pair of lens arrays changes the light intensity distribution projected on the predetermined plane.

14. The exposure apparatus according to claim 11, wherein the pair of lens arrays are configured to be moved, such that a distance between the lens arrays changes to adjust a position of a peak of the light intensity distribution projected on the predetermined plane.

15. The exposure apparatus according to claim 11, wherein the pair of lens arrays are configured to be moved, such that a distance between the lens arrays changes to adjust the light intensity distribution between a first light intensity distribution having a peak in a center area including the optical axis, and a second light intensity distribution having a peak in an outside area not including the optical axis.

16. The exposure apparatus according to claim 11, wherein one of the pair of lens arrays on a side closer to the LED array is configured to be moved to change the distance between the pair of lens arrays.

17. The exposure apparatus according to claim 11, further comprising a dividing unit configured to move at least one of the pair of lens arrays.

18. The exposure apparatus according to claim 11,
wherein the LED arrays include first and second LED arrays, a first lens array of the pair of lens arrays is configured to collect light from the first LED array, and a second lens array of the pair of lens array is configured to collect light from the second LED array, and
wherein at least one of the first and second lens arrays is movable.

19. The exposure apparatus according to claim 11, further comprising a control unit configured to individually control an output of the first LED array and the second LED array.

* * * * *